United States Patent
Zhang et al.

(10) Patent No.: US 10,212,383 B2
(45) Date of Patent: Feb. 19, 2019

(54) STANDBY CONTROL CIRCUIT AND DISPLAY DEVICE

(71) Applicants: BOE TECHNOLOGY GROUP CO., LTD., Beijing (CN); Beijing BOE Multimedia Technology Co., Ltd., Beijing (CN)

(72) Inventors: Jiajian Zhang, Beijing (CN); Jianting Wang, Beijing (CN); Junning Su, Beijing (CN); Naijia Guo, Beijing (CN)

(73) Assignees: BOE TECHNOLOGY GROUP CO., LTD., Beijing (CN); BEIJING BOE MULTIMEDIA TECHNOLOGY CO., LTD., Beijing (CN)

( * ) Notice: Subject to any disclaimer, the term of this patent is extended or adjusted under 35 U.S.C. 154(b) by 59 days.

(21) Appl. No.: 15/104,760

(22) PCT Filed: Jan. 14, 2016

(86) PCT No.: PCT/CN2016/070860
§ 371 (c)(1),
(2) Date: Jun. 15, 2016

(87) PCT Pub. No.: WO2017/016200
PCT Pub. Date: Feb. 2, 2017

(65) Prior Publication Data
US 2017/0201712 A1 Jul. 13, 2017

(30) Foreign Application Priority Data
Jul. 30, 2015 (CN) .......................... 2015 1 0461141

(51) Int. Cl.
*H02J 9/00* (2006.01)
*H04N 5/63* (2006.01)
(Continued)

(52) U.S. Cl.
CPC ............... *H04N 5/63* (2013.01); *H02J 9/005* (2013.01); *H03K 17/722* (2013.01);
(Continued)

(58) Field of Classification Search
CPC .......... H04N 5/63; H02J 9/005; H03K 17/785
See application file for complete search history.

(56) References Cited

U.S. PATENT DOCUMENTS 5,081,426 A * 1/1992 Imanishi ................. H03F 1/305
330/267
6,292,233 B1 9/2001 Erba et al.
(Continued)

FOREIGN PATENT DOCUMENTS

CN 1398031 A 2/2003
CN 101419434 A 4/2009
(Continued)

OTHER PUBLICATIONS

International Search Report dated Mar. 31, 2016 issued in corresponding International Application No. PCT/CN2016/070860 along with an English translation of the Written Opinion of the International Searching Authority.
(Continued)

*Primary Examiner* — Michael E Teitelbaum
(74) *Attorney, Agent, or Firm* — Nath, Goldberg & Meyer; Joshua B. Goldberg; Daniel Bissing

(57) ABSTRACT

The invention discloses a standby control circuit and a display device. The standby control circuit includes a standby module, at least one power board, and a transistor switch control module comprising at least one transistor switch whose number is equal to that of the at least one power board, each transistor switch is connected between one power board and a mains supply input terminal, the standby module is configured to generate a trigger signal and
(Continued)

send the generated trigger signal to each transistor switch, and each transistor switch is configured to be turned on upon receipt of the trigger signal sent from the standby module so as to connect the power board connected thereto with the mains supply input terminal.

14 Claims, 1 Drawing Sheet

(51) Int. Cl.

| | | |
|---|---|---|
| H03K 17/79 | (2006.01) | |
| H03K 19/00 | (2006.01) | |
| H03K 17/722 | (2006.01) | |
| H03K 17/725 | (2006.01) | |
| H03K 17/785 | (2006.01) | |
| H03K 17/795 | (2006.01) | |

(52) U.S. Cl.
CPC ......... *H03K 17/725* (2013.01); *H03K 17/785* (2013.01); *H03K 17/79* (2013.01); *H03K 17/7955* (2013.01); *H03K 19/0016* (2013.01)

(56) References Cited

U.S. PATENT DOCUMENTS 8,604,646 B2   12/2013   Chen et al.

2003/0011247 A1*   1/2003   Kajiwara ................ G06F 1/263
                                                                  307/125
2010/0096928 A1*   4/2010   Li ............................ H02M 1/36
                                                                    307/66
2011/0057520 A1*   3/2011   Chen ........................ G06F 1/26
                                                                   307/125

FOREIGN PATENT DOCUMENTS

| CN | 201307902 Y | 9/2009 |
| CN | 201319643 Y | 9/2009 |
| CN | 201623782 U | 11/2010 |
| CN | 103516234 A | 1/2014 |
| CN | 103888697   | 6/2014 |
| CN | 103888697 A | 6/2014 |
| CN | 105187748 A | 12/2015 |
| TW | 201109908 A | 3/2011 |

OTHER PUBLICATIONS

Office Action dated Oct. 31, 2017 issued in corresponding Chinese Application No. 201510461141.8.

* cited by examiner

STANDBY CONTROL CIRCUIT AND DISPLAY DEVICE

This is a National Phase Application filed under 35 U.S.C. 371 as a national stage of PCT/CN2016/070860, filed Jan. 14, 2016, an application claiming the benefit of Chinese Application No. 201510461141.8, filed on Jul. 30, 2015, the content of each of which is hereby incorporated by reference in its entirety.

FIELD OF THE INVENTION

The present invention relates to the field of display technology, and particularly relates to a standby control circuit and a display device including the same.

BACKGROUND OF THE INVENTION

In the design process of a large-size display product such as a television, power of supply tends to be high, the number of output voltages is relatively large, and circuit design is relatively complex. A high-power power board has a complex structure, a large number of sampled signals, and various protective functions, which results in high standby power consumption. A splice plate formed of multiple power boards has not only a complicated circuit, but also a standby power consumption multiple times as large as that of a single power board.

In order to address the problem of too high standby power consumption of circuits caused by the high-power power board and the splice plate, an existing solution is to add contact switches (e.g., relays) to control respective power switches. However, the relays have certain disadvantages in use: when the system enters the working state from the standby state, the relays may produce very loud noises, and it is very likely to produce a spark when contacts thereof get into contact, which is a potential security problem; meanwhile, a relatively large surge current is generated at the moment of power-on, which is prone to causing a false triggering of protective devices, and thus affects user's operation experience.

SUMMARY OF THE INVENTION

An object of the present invention is to provide a standby control circuit and a display device including the same, so as to solve the technical problem of too high standby power consumption of circuits when a large-size display product uses a high-power power board or multiple power boards spliced together.

In order to solve the above technical problem, as an aspect of the present invention, there is provided a standby control circuit, including a standby module, at least one power board, and a transistor switch control module which includes at least one transistor switch whose number is equal to that of the power board, each transistor switch is connected between one power board and a mains supply input terminal, the standby module is configured to generate a trigger signal and send the generated trigger signal to each transistor switch, and each transistor switch is able to be turned on upon receipt of the trigger signal sent from the standby module so as to connect the power board connected thereto with the mains supply input terminal.

Optionally, the transistor switch is an SCR device, which has a first electrode connected to the mains supply input terminal, a second electrode connected to an input terminal of the power board, and a control electrode used for receiving the trigger signal sent from the standby module.

Optionally, the SCR device is a bidirectional SCR device, which is turned on when a forward voltage signal is inputted to a first electrode of the bidirectional SCR device from the mains supply input terminal and a control electrode of the bidirectional SCR device receives the trigger signal sent from the standby module, and is turned off automatically when a reverse voltage signal is inputted to the first electrode of the bidirectional SCR device from the mains supply input terminal.

Optionally, the standby module is configured to receive an enable signal, and generate, based on the enable signal, the trigger signal for turning on the transistor switch.

Optionally, the standby module includes a photocoupler and a first transistor, the photocoupler including a light emitter and a light receiver, the light emitter having a first terminal connected to a high-level signal terminal and a second terminal connected to a first electrode of the first transistor, a control electrode of the first transistor being used for receiving the enable signal and a second electrode of the first transistor being connected to a low-level signal terminal, the light emitter being capable of converting an electrical signal inputted from the high-level signal terminal into an optical signal, and the light receiver being capable of receiving the optical signal generated by the light emitter, converting the optical signal into an electrical signal again, and then outputting the electrical signal to the transistor switch control module.

Optionally, the light emitter is a photodiode having an anode connected to the high-level signal terminal and a cathode connected to the first electrode of the first transistor; and the light receiver is a phototransistor having a base used for receiving the optical signal generated by the light emitter, a collector connected to the mains supply input terminal, and an emitter connected to the transistor switch control module and used for outputting an electrical signal converted by the phototransistor, the converted electrical signal being used for generating the trigger signal for turning on each transistor switch.

Optionally, a voltage of the high-level signal terminal ranges from 5V to 10V, and the low-level signal terminal is a ground terminal.

Optionally, the standby control circuit includes two power boards which are a first power board and a second power board, the transistor switch control module includes two transistor switches which are a first SCR device connected between the mains supply input terminal and an input terminal of the first power board, and a second SCR device connected between the mains supply input terminal and an input terminal of the second power board; and the transistor switch control module further includes a delay unit, which is connected to control electrodes of the first SCR device and the second SCR device, respectively, and used for controlling turn-on timings of the first SCR device and the second SCR device, respectively.

Optionally, the transistor switch control module further includes a second transistor, and the delay unit includes a third transistor, a fourth transistor, a first resistor, a second resistor, a first capacitor and a second capacitor;

a control electrode of the second transistor is connected to an output terminal of the light receiver used for outputting the converted electrical signal, a first electrode of the second transistor is connected to the mains supply input terminal, and a second electrode of the second transistor is connected to control electrodes of the third transistor and the fourth transistor via the first resistor and the second resistor, respectively; a first electrode of the third transistor is connected to the control electrode of the first SCR device, and a second electrode of the third transistor is connected to the low-level signal terminal; a first electrode of the fourth transistor is connected to the control electrode of the second SCR device, and a second electrode of the fourth transistor is connected to the low-level signal terminal; and a first terminal of the first capacitor is connected to the control electrode of the third transistor, and a second terminal of the first capacitor is connected to the low-level signal terminal; a first terminal of the second capacitor is connected to the control electrode of the fourth transistor, and a second terminal of the second capacitor is connected to the low-level signal terminal.

As another aspect of the present invention, there is also provided a display device which includes the above standby control circuit provided by the present invention.

In the present invention, the standby module is provided separately from the power board, and the connection or disconnection between a power board and the mains supply input terminal is controlled by a transistor switch corresponding to the power board, which can reduce the standby power consumption of circuits effectively, and solve the problem of too high standby power consumption of circuits caused by the high-power power boards spliced together. In addition, the present invention can realize independent timing controls of the respective power boards, so as to solve the problem of too large surge current at the moment of power-on.

BRIEF DESCRIPTION OF THE DRAWINGS

The accompanying drawings, which serve to provide a further understanding of the present invention and constitute a part of the specification, are used for explaining the present invention together with the following specific implementations, rather than limiting the present invention.

DETAILED DESCRIPTION OF THE EMBODIMENTS

Specific implementations of the present invention will be described in detail below in conjunction with the accompanying drawings. It should be understood that the specific implementations described herein are merely used for describing and explaining the present invention, rather than limiting the present invention.

Figure 1:
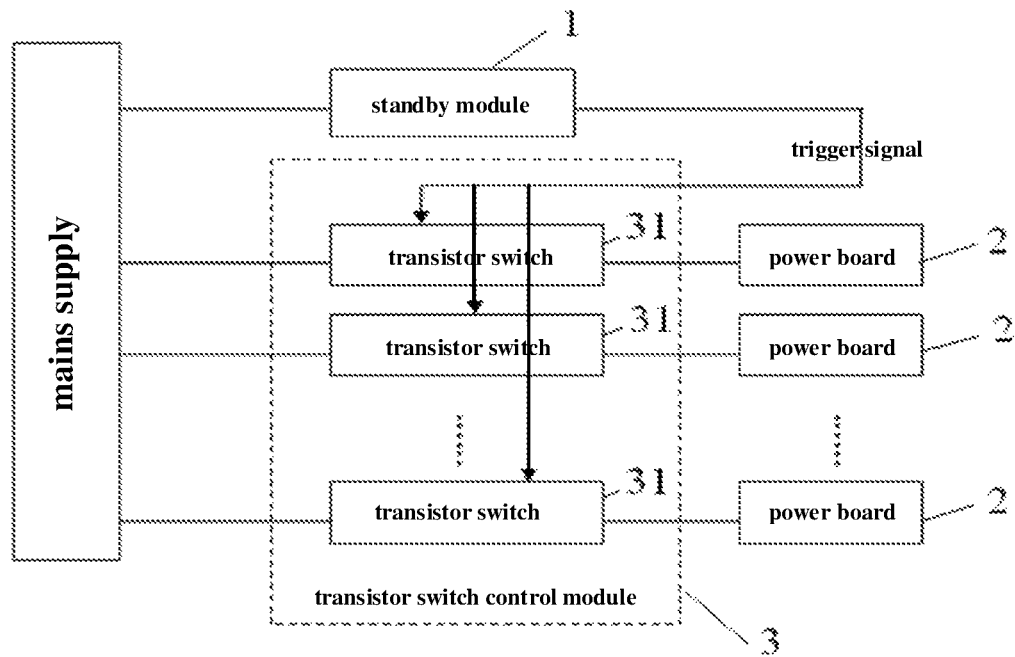
FIG. 1 is a block diagram of a structure of a standby control circuit provided by an embodiment of the present invention.

An embodiment of the present invention provides a standby control circuit, which, as shown in FIG. 1, includes a standby module 1, at least one power board 2, and a transistor switch control module 3. The transistor switch control module 3 includes at least one transistor switch 31. The number of the transistor switch(es) 31 is equal to that of the power board(s) 2, and each transistor switch 31 is connected between one power board 2 and a mains supply input terminal and corresponds to said one power board 2. The standby module 1 is configured to generate a trigger signal, and send the generated trigger signal to each transistor switch 31; the transistor switch 31 is configured to be turned on upon receipt of the trigger signal sent from the standby module 1 so as to connect the power board 2 connected thereto with the mains supply input terminal.

Here, the mains supply input terminal refers to a live line terminal of the mains supply.

In the embodiment of the present invention, the standby module 1 is provided separately from the power board(s) 2, and the connection or disconnection between a power board 2 and the mains supply input terminal is controlled by a transistor switch 31 corresponding to the power board 2, which can reduce the standby power consumption of circuits effectively, and solve the problem of too high standby power consumption of circuits caused by the high-power power board or multiple power boards spliced together.

In addition, the transistor switch 31 in the embodiment has advantages such as low operating noise and small transient surge current, and thus can reduce security risks effectively and improve user's operation experience.

Preferably, the transistor switch 31 is an SCR (Silicon Controlled Rectifier) device. A first electrode of the SCR device is connected to the mains supply input terminal, a second electrode of the SCR device is connected to an input terminal of the power board 2, and a control electrode of the SCR device is used for receiving the trigger signal sent from the standby module 1.

Working principle of the SCR device will be described as follows by taking the case in which the first electrode of the SCR device is an anode and the second electrode of the SCR device is a cathode as an example: when a forward voltage is applied between the anode and cathode of the SCR device, and a forward trigger voltage is input between the control electrode and cathode of the SCR device, the SCR device is turned on; after the trigger voltage is removed, the SCR device is turned off if a reverse voltage is applied between the anode and cathode of the SCR device.

In some embodiments of the present invention, the transistor switch 31 may be a bidirectional SCR device. A first electrode and a second electrode of the bidirectional SCR device each may be an anode or a cathode. When a forward voltage signal is inputted to the first electrode of the bidirectional SCR device from the mains supply input terminal and a control electrode of the bidirectional SCR device receives the trigger signal sent from the standby module 1, the bidirectional SCR device is turned on; when a reverse voltage signal is inputted to the first electrode of the bidirectional SCR device from the mains supply input terminal, the bidirectional SCR device is turned off automatically. That is to say, when an alternating voltage provided by the mains supply enters negative half circle, the bidirectional SCR device will be turned off automatically, and at this time, the power board 2 has no input, thus solving the technical problem of too high standby power consumption of circuits.

Further, the standby module 1 may be configured to receive an enable signal, and generate, according to the enable signal, the trigger signal which causes the transistor switch 31 to be turned on. By taking a television as an example, the enable signal here may be a remote control signal from a remote controller, a button signal from a button in the housing of the television, or the like.

Figure 2:
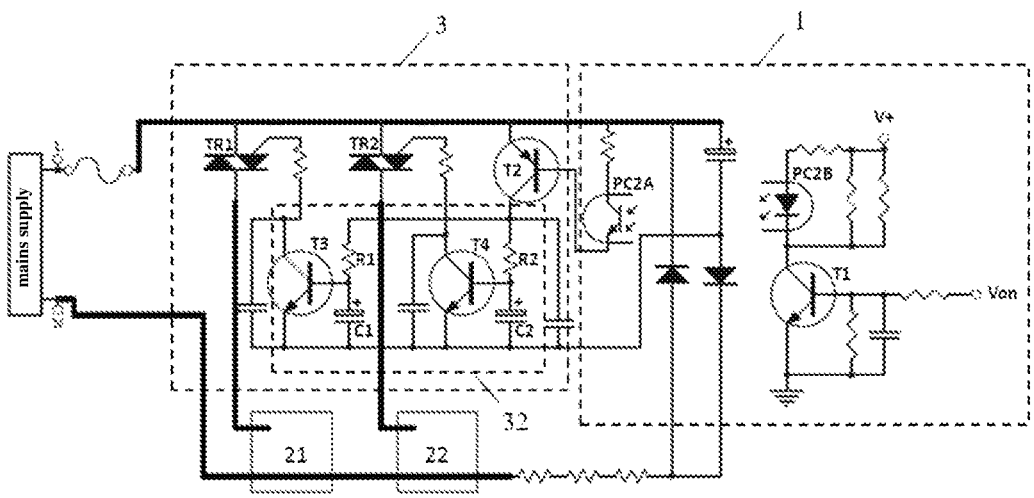
FIG. 2 is an exemplary circuit diagram of a standby control circuit provided by an embodiment of the present invention.

FIG. 2 is an exemplary circuit diagram of a standby control circuit provided by an embodiment of the present invention. As shown in FIG. 2, the standby module 1 includes a photocoupler and a first transistor T1, and the photocoupler includes a light emitter PC2B and a light receiver PC2A. A first terminal of the light emitter PC2B is connected to a high-level signal terminal V+, a second terminal of the light emitter PC2B is connected to a first electrode of the first transistor T1, a control electrode of the first transistor T1 is used for receiving an enable signal Von, and a second electrode of the first transistor T1 is connected to a low-level signal terminal.

The light emitter PC2B is able to convert an electrical signal inputted from the high-level signal terminal V+ into an optical signal, and the light receiver PC2A is able to receive the optical signal generated by the light emitter PC2B, convert the optical signal into an electrical signal again, and then output the generated electrical signal to the transistor switch control module 3.

Further, the light emitter PC2B may be a photodiode. An anode (i.e., a first terminal) of the photodiode is connected to the high-level signal terminal V+, and a cathode (i.e., a second terminal) of the photodiode is connected to the first electrode of the first transistor T1. The light receiver PC2A may be a phototransistor. A base of the phototransistor is used for receiving the optical signal generated by the light emitter PC2B, a collector of the phototransistor is connected to the mains supply input terminal (i.e., a live line terminal L in FIG. 2), and an emitter of the phototransistor is connected to the transistor switch control module 3, and used for outputting an electrical signal converted by the phototransistor, the converted electrical signal being used for generating a trigger signal which turns on the SCR device.

It can be understood that, in the embodiment shown in FIG. 2, the anode of the light emitter PC2B is equivalent to an input terminal of the photocoupler, and the emitter of the light receiver PC2A is equivalent to an output terminal of the photocoupler. The output terminal of the photocoupler is connected to the transistor switch control module 3, and the electrical signal outputted from the emitter of the light receiver PC2A is an intermediate signal generated based on the enable signal Von, the intermediate signal being used for further generating the trigger signal that turns on the SCR device.

Preferably, a voltage of the high-level signal terminal V+ ranges from 5V to 10V, and the low-level signal terminal is a ground terminal.

Further, as shown in FIG. 2, by taking the case in which the standby control circuit includes two power boards as an example, the two power boards are a first power board 21 and a second power board 22, respectively, and accordingly, the transistor switch control module 3 includes two transistor switches, which are a first SCR device TR1 and a second SCR device TR2, respectively. The first SCR device TR1 is connected between the mains supply input terminal and an input terminal of the first power board 21, and the second SCR device TR2 is connected between the mains supply input terminal and an input terminal of the second power board 22.

Generally, the mains supply includes a live line terminal L and a null line terminal N, and the mains supply input terminal in the embodiment refers to the live line terminal L.

The transistor switch control module 3 may further include a delay unit 32, which is connected to a control electrode of the first SCR device TR1 and a control electrode of the second SCR device TR2, respectively, and used for controlling turn-on timings of the first SCR device TR1 and the second SCR device TR2, respectively.

That is to say, in the embodiment of the present invention, turn-on timings of the first SCR device TR1 and the second SCR device TR2 can be controlled by the delay unit 32. For example, the first SCR device TR1 and the second SCR device TR2 can be controlled to be turned on simultaneously, or can be controlled to be turned on after being delayed for respective predetermined periods of time. Thus, the power boards in the embodiment of the present invention can be controlled in a time division manner, so that the problem of too large surge current generated at the moment of power-on due to simultaneous connections of multiple power boards to the mains supply is avoided.

Specifically, referring to FIG. 2, the transistor switch control module 3 may further include a second transistor T2, and the delay unit 32 may include a third transistor T3, a fourth transistor T4, a first resistor R1, a second resistor R2, a first capacitor C1 and a second capacitor C2.

A control electrode of the second transistor T2 is connected to an output terminal of the light receiver PC2A used for outputting the converted electrical signal (i.e., the output terminal of the photocoupler), a first electrode of the second transistor T2 is connected to the mains supply input terminal (i.e., live line terminal L), and a second electrode of the second transistor T2 is connected to control electrodes of the third and fourth transistors T3 and T4 via the first and second resistors R1 and R2, respectively; a first electrode of the third transistor T3 is connected to the control electrode of the first SCR device TR1, and a second electrode of the third transistor T3 is connected to the low-level signal terminal; a first electrode of the fourth transistor T4 is connected to the control electrode of the second SCR device TR2, and a second electrode of the fourth transistor T4 is connected to the low-level signal terminal. Here, the low-level signal terminal may be a ground terminal or the null line terminal N.

As described above, the first resistor R1 is connected between the second electrode of the second transistor T2 and the control electrode of the third transistor T3, and the second resistor R2 is connected between the second electrode of the second transistor T2 and the control electrode of the fourth transistor T4. In addition, a first terminal of the first capacitor C1 is connected to the control electrode of the third transistor T3, and a second terminal of the first capacitor C1 is connected to the low-level signal terminal; a first terminal of the second capacitor C2 is connected to the control electrode of the fourth transistor T4, and a second terminal of the second capacitor C2 is connected to the low-level signal terminal.

After an electrical signal, as the intermediate signal, is outputted from the emitter of the light receiver PC2A to the transistor switch control module 3 (specifically, to the control electrode of the second transistor T2), the second transistor T2 is turned on, and then the third transistor T3 and the fourth transistor T4 are turned on, so that the first SCR device TR1 and the second SCR device TR2 receive, at the respective control electrodes thereof, the trigger signal for turning on themselves.

In some embodiments of the present invention, turn-on timings of the third transistor T3 and the fourth transistor T4 can be set respectively, by reasonably setting resistance values of the first resistor R1 and the second resistor R2 and capacitance values of the first capacitor C1 and the second capacitor C2, so that turn-on timings of the first SCR device TR1 and the second SCR device TR2 can be controlled, and further, independent timing controls of the first power board 21 and the second power board 22 are realized, thereby solving the technical problem of too large surge current caused by simultaneous energization of multiple power boards in the prior art.

Working process of the standby control circuit shown in FIG. 2 will be described in detail below. In FIG. 2, each of the first SCR device TR1 and the second SCR device TR2 is a P-type bidirectional SCR device, that is, each is turned on when a low level is applied to the control electrode thereof.

In standby, the first SCR device TR1 and the second SCR device TR2 are in an off state, no voltage is inputted to the first power board 21 and the second power board 22, and thus no power consumption is caused.

When an enable signal Von at a high level is inputted to the standby module 1, the first transistor T1 is turned on, the light emitter PC2B of the photocoupler is turned on and emits light, and the light receiver PC2A is turned on after receiving an optical signal generated by the light emitter PC2B, and outputs an electrical signal, as an intermediate signal, to the control electrode of the second transistor T2, so as to turn on the second transistor T2.

After the second transistor T2 is turned on, the third transistor T3 and the fourth transistor T4 are turned on, the control electrodes of the first SCR device TR1 and the second SCR device TR2 are pulled down to a low level, and the first electrodes of the first SCR device TR1 and the second SCR device TR2 are at high levels relative to the respective second electrodes thereof. At this point, since the first SCR device TR1 and the second SCR device TR2 are both P-type bidirectional SCR devices, the first SCR device TR1 and the second SCR device TR2 are turned on, and the first power board 21 and the second power board 22 start to work.

Also, after the second transistor T2 is turned on, a signal outputted from the second transistor T2 charges the first capacitor C1 via the first resistor R1, and charges the second capacitor C2 via the second resistor R2, respectively. Activation of the third transistor T3 and the fourth transistor T4 may be delayed, so as to respectively control turn-on timings thereof (for example, the third transistor T3 and the fourth transistor T4 are turned on at different times by using the delay unit 32), by reasonably setting resistance values of the first resistor R1 and the second resistor R2 and capacitance values of the first capacitor C1 and the second capacitor C2, so that the problem of too large surge current at the moment of power-on is solved, false triggering of protective devices can be prevented, and influence on user's operation experience is avoided.

To power off, an enable signal Von at a low level is inputted to the standby module 1, and at this point, the first transistor T1, the second transistor T2, the third transistor T3 and the fourth transistor T4 are all turned off. When an alternating voltage signal inputted from the mains supply input terminal (i.e., live line terminal L) enters its negative half cycle, the first electrodes of the first SCR device TR1 and the second SCR device TR2 are at low levels relative to the respective second electrodes thereof, at this point, the first SCR device TR1 and the second SCR device TR2 are turned off, and no voltage is inputted to the first power board 21 and the second power board 22.

An embodiment of the present invention also provides a display device, which includes the above standby control circuit provided in the embodiments of the present invention. As described above, in the display device provided in the embodiment of the present invention, standby power consumption of circuits can be reduced effectively, and the problem of too high standby power consumption of circuits caused by the high-power power board or multiple power boards spliced together can be solved. Also, in the display device, independent timing controls of the respective power boards can be realized, so as to solve the problem of too large surge current at the moment of power-on and improve user's operation experience.

It can be understood that, the above implementations are merely exemplary implementations used for explaining the principle of the present invention, but the present invention is not limited thereto. For those skilled in the art, various modifications and improvements may be made without departing from the spirit and essence of the present invention, and these modifications and improvements are also deemed as falling within the protection scope of the present invention.

The invention claimed is:

1. A standby control circuit, comprising a standby module and at least one power board, wherein, the standby control circuit further comprises a transistor switch control module comprising at least one transistor switch whose number is equal to that of the at least one power board, each transistor switch is connected between one power board and a mains supply input terminal, the at least one transistor switch and the standby module are provided separately, the standby module is configured to generate a trigger signal and send the generated trigger signal to each transistor switch, and each transistor switch is configured to be turned on upon receipt of the trigger signal sent from the standby module so as to connect the power board connected thereto with the mains supply input terminal, wherein the transistor switch is an SCR device, which has a first electrode connected to the mains supply input terminal, a second electrode connected to an input terminal of the power board, and a control electrode used for receiving the trigger signal sent from the standby module, wherein the SCR device is a bidirectional SCR device, which is turned on when a forward voltage signal is inputted to a first electrode of the bidirectional SCR device from the mains supply input terminal and a control electrode of the bidirectional SCR receives the trigger signal sent from the standby module, and is turned off automatically when a reverse voltage signal is inputted to the first electrode of the bidirectional SCR device from the mains supply input terminal.

2. The standby control circuit according to claim 1, wherein, the standby module is configured to receive an enable signal, and generate, based on the enable signal, the trigger signal for turning on the transistor switch.

3. The standby control circuit according to claim 2, wherein, the standby module comprises a photocoupler and a first transistor, the photocoupler comprises a light emitter and a light receiver, the light emitter has a first terminal connected to a high-level signal terminal and a second terminal connected to a first electrode of the first transistor, a control electrode of the first transistor is used for receiving the enable signal and a second electrode of the first transistor is connected to a low-level signal terminal, the light emitter is capable of converting an electrical signal inputted from the high-level signal terminal into an optical signal, and the light receiver is capable of receiving the optical signal generated by the light emitter, converting the optical signal into an electrical signal again, and then outputting the electrical signal to the transistor switch control module.

4. The standby control circuit according to claim 3, wherein, the light emitter is a photodiode having an anode connected to the high-level signal terminal and a cathode connected to the first electrode of the first transistor; and the light receiver is a phototransistor having a base used for receiving the optical signal generated by the light emitter, a collector connected to the mains supply input terminal, and an emitter connected to the transistor switch control module and used for outputting an electrical signal converted by the phototransistor, the converted electrical signal being used for generating the trigger signal for turning on each transistor switch.

5. The standby control circuit according to claim 3, wherein, a voltage of the high-level signal terminal ranges from 5V to 10V, and the low-level signal terminal is a ground terminal.

6. The standby control circuit according to claim 3, wherein, the standby control circuit comprises a first power board and a second power board, the transistor switch control module comprises a first SCR device connected between the mains supply input terminal and an input terminal of the first power board, and a second SCR device connected between the mains supply input terminal and an input terminal of the second power board; and the transistor switch control module further comprises a delay unit, which is connected to control electrodes of the first SCR device and the second SCR device, respectively, and used for controlling turn-on timings of the first SCR device and the second SCR device, respectively.

7. The standby control circuit according to claim 6, wherein, the transistor switch control module further comprises a second transistor, and the delay unit comprises a third transistor, a fourth transistor, a first resistor, a second resistor, a first capacitor and a second capacitor;

a control electrode of the second transistor is connected to an output terminal of the light receiver used for outputting the converted electrical signal, a first electrode of the second transistor is connected to the mains supply input terminal, and a second electrode of the second transistor is connected to control electrodes of the third transistor and the fourth transistor via the first resistor and the second resistor, respectively; a first electrode of the third transistor is connected to the control electrode of the first SCR device, and a second electrode of the third transistor is connected to the low-level signal terminal; a first electrode of the fourth transistor is connected to the control electrode of the second SCR device, and a second electrode of the fourth transistor is connected to the low-level signal terminal; and a first terminal of the first capacitor is connected to the control electrode of the third transistor, and a second terminal of the first capacitor is connected to the low-level signal terminal; a first terminal of the second capacitor is connected to the control electrode of the fourth transistor, and a second terminal of the second capacitor is connected to the low-level signal terminal.

8. A display device, comprising the standby control circuit according to claim 1.

9. The display device according to claim 8, wherein, the standby module is configured to receive an enable signal, and generate, based on the enable signal, the trigger signal for turning on the transistor switch.

10. The display device according to claim 9, wherein, the standby module comprises a photocoupler and a first transistor, the photocoupler comprises a light emitter and a light receiver, the light emitter has a first terminal connected to a high-level signal terminal and a second terminal connected to a first electrode of the first transistor, a control electrode of the first transistor is used for receiving the enable signal and a second electrode of the first transistor is connected to a low-level signal terminal, the light emitter is capable of converting an electrical signal inputted from the high-level signal terminal into an optical signal, and the light receiver is capable of receiving the optical signal generated by the light emitter, converting the optical signal into an electrical signal again, and then outputting the electrical signal to the transistor switch control module.

11. The display device according to claim 10, wherein,
the light emitter is a photodiode having an anode connected to the high-level signal terminal and a cathode connected to the first electrode of the first transistor; and
the light receiver is a phototransistor having a base used for receiving the optical signal generated by the light emitter, a collector connected to the mains supply input terminal, and an emitter connected to the transistor switch control module and used for outputting an electrical signal converted by the phototransistor, the converted electrical signal being used for generating the trigger signal for turning on each transistor switch.

12. The display device according to claim 10, wherein, a voltage of the high-level signal terminal ranges from 5V to 10V, and the low-level signal terminal is a ground terminal.

13. The display device according to claim 10, wherein, the standby control circuit comprises a first power board and a second power board, the transistor switch control module comprises a first SCR device connected between the mains supply input terminal and an input terminal of the first power board, and a second SCR device connected between the mains supply input terminal and an input terminal of the second power board; and the transistor switch control module further comprises a delay unit, which is connected to control electrodes of the first SCR device and the second SCR device, respectively, and used for controlling turn-on timings of the first SCR device and the second SCR device, respectively.

14. The display device according to claim 13, wherein, the transistor switch control module further comprises a second transistor, and the delay unit comprises a third transistor, a fourth transistor, a first resistor, a second resistor, a first capacitor and a second capacitor;

a control electrode of the second transistor is connected to an output terminal of the light receiver used for outputting the converted electrical signal, a first electrode of the second transistor is connected to the mains supply input terminal, and a second electrode of the second transistor is connected to control electrodes of the third transistor and the fourth transistor via the first resistor and the second resistor, respectively; a first electrode of the third transistor is connected to the control electrode of the first SCR device, and a second electrode of the third transistor is connected to the low-level signal terminal; a first electrode of the fourth transistor is connected to the control electrode of the second SCR device, and a second electrode of the fourth transistor is connected to the low-level signal terminal; and a first terminal of the first capacitor is connected to the control electrode of the third transistor, and a second terminal of the first capacitor is connected to the low-level signal terminal; a first terminal of the second capacitor is connected to the control electrode of the fourth transistor, and a second terminal of the second capacitor is connected to the low-level signal terminal.

* * * * *